United States Patent
Wu et al.

(10) Patent No.: US 10,276,449 B1
(45) Date of Patent: Apr. 30, 2019

(54) METHOD FOR FORMING FIN FIELD EFFECT TRANSISTOR (FINFET) DEVICE STRUCTURE

(71) Applicant: Taiwan Semiconductor Manufacturing Co., Ltd., Hsinchu (TW)

(72) Inventors: Chung-Shu Wu, Taoyuan (TW); Ying-Ya Hsu, Hsinchu (TW); Shu-Uei Jang, Hsinchu (TW); Yu-Wen Wang, New Taipei (TW); Ryan Chia-Jen Chen, Chiayi (TW); An-Chyi Wei, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/821,904

(22) Filed: Nov. 24, 2017

(51) Int. Cl.
| H01L 21/76 | (2006.01) |
| H01L 21/8234 | (2006.01) |
| H01L 27/088 | (2006.01) |
| H01L 29/165 | (2006.01) |
| H01L 21/311 | (2006.01) |

(52) U.S. Cl.
CPC ........ *H01L 21/823481* (2013.01); *H01L 21/31111* (2013.01); *H01L 21/31116* (2013.01); *H01L 21/823431* (2013.01); *H01L 27/0886* (2013.01); *H01L 29/165* (2013.01)

(58) Field of Classification Search
CPC ....... H01L 21/823481; H01L 21/31116; H01L 21/31111; H01L 27/0886; H01L 21/823431; H01L 29/165
USPC .......................................................... 438/400
See application file for complete search history.

(56) References Cited

U.S. PATENT DOCUMENTS

| 7,151,295 B2 * | 12/2006 | Yaegashi ............... H01L 27/115 257/316 |
| 8,796,666 B1 | 8/2014 | Huang et al. |
| 8,815,712 B2 | 8/2014 | Wan et al. |
| 8,963,258 B2 | 2/2015 | Yu et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,576,814 B2 | 2/2017 | Wu et al. |

(Continued)

*Primary Examiner* — Vu A Vu
(74) *Attorney, Agent, or Firm* — Birch, Stewart, Kolasch & Birch, LLP

(57) ABSTRACT

A method for forming a semiconductor device structure includes providing a substrate having a first fin structure and a second fin structure that are capped by a patterned hard mask structure. A liner layer and an overlying insulating layer are formed between the first and second fin structures. A multi-step etching process including a first step of selectively removing the patterned hard mask structure and a second step of in-situ and selectively removing a portion of the insulating layer to form an isolation feature is performed. The process gas used in the multi-step etching process includes a first etching gas and a second etching gas. The flow rate of the first etching gas is greater than that of the second etching gas in the first step and the flow rate of the first etching gas is less than that of the second etching gas in the second step.

20 Claims, 14 Drawing Sheets

(56) References Cited

U.S. PATENT DOCUMENTS

2011/0097889 A1* 4/2011 Yuan .................. H01L 21/76224
438/595
2012/0309165 A1* 12/2012 Nan .................. H01L 27/10876
438/424

* cited by examiner

METHOD FOR FORMING FIN FIELD EFFECT TRANSISTOR (FINFET) DEVICE STRUCTURE

BACKGROUND

The semiconductor industry has experienced rapid growth and demands for highly integrated semiconductor devices are increasing. Technological advances in integrated circuit (IC) design and materials have produced generations of ICs. Each generation has smaller and more complex circuits than previous generations. In the course of IC evolution, functional density has generally increased while geometric size (i.e., the smallest component (or line) that can be created through a fabrication process) has decreased.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

Although existing FinFET devices and methods of fabricating FinFET devices have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
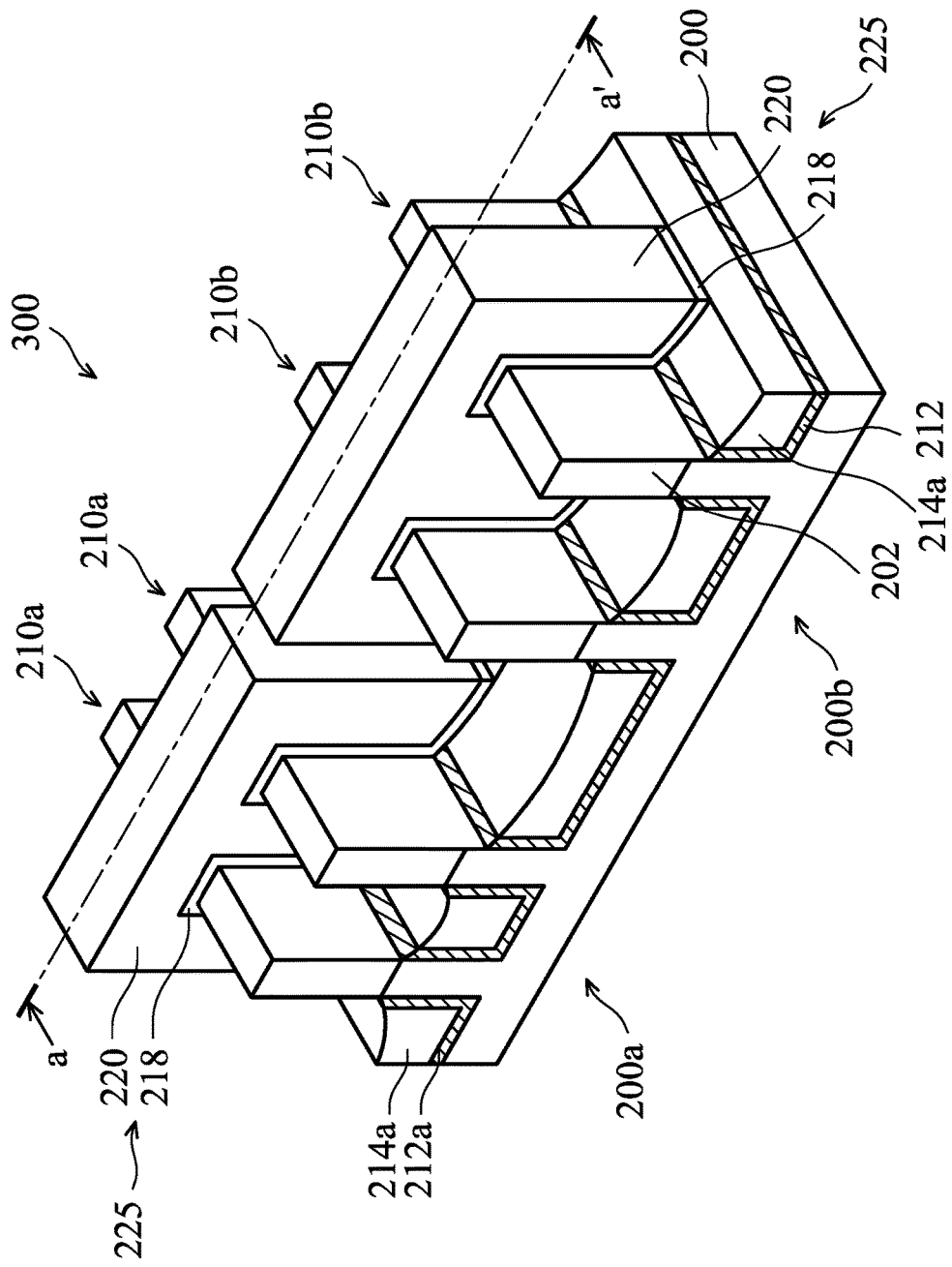
FIG. 1 is a perspective view of a semiconductor device structure with fin field-effect transistors (FinFETs), in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows includes embodiments in which the first and second features are formed in direct contact, and may also include embodiments in which additional features may be formed between the first and second features, such that the first and second features may not be in direct contact. The present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-alignment process. The sacrificial layer is then removed, and the remaining spacers may then be used to pattern the fins.

Embodiments of a semiconductor device structure and a method for forming the same are provided. FIG. 1 is a perspective view of a semiconductor device structure 300 with fin field-effect transistors (FinFETs), in accordance with some embodiments. The semiconductor device structure 300 includes a substrate 200 having a first region 200a (e.g., a dense fin region) and a second region 200b (e.g., an isolated fin region). The substrate 200 may be made of silicon or other semiconductor materials. In some embodiments, the substrate 200 is a silicon wafer. Alternatively or additionally, the substrate 200 may include other elementary semiconductor materials such as germanium. In some embodiments, the substrate 200 is made of a compound semiconductor such as silicon carbide, gallium arsenic, indium arsenide, or indium phosphide. In some embodiments, the substrate 200 is made of an alloy semiconductor such as silicon germanium, silicon germanium carbide, gallium arsenic phosphide, or gallium indium phosphide. In some embodiments, the substrate 200 includes an epitaxial layer. For example, the substrate 200 has an epitaxial layer overlying a bulk semiconductor.

In some embodiments, a material layer 202 is formed over the substrate 200. The material layer 202 and the substrate 200 are made of different materials. In some embodiments, the material layer 202 is made of silicon germanium (SiGe). The material layer 202 is formed by an epitaxial process. The epitaxial process may include a selective epitaxy growth (SEG) process, CVD deposition techniques (e.g., vapor-phase epitaxy (VPE) and/or ultra-high vacuum CVD (UHV-CVD)), molecular beam epitaxy (MBE), or other suitable epitaxial processes.

In some embodiments, one or more first fin structures 210a may be formed protruding from the first region 200a of the semiconductor substrate 200 and one or more second fin structures 210b may be formed protruding from the second region 200b of the semiconductor substrate 200. In some embodiments, the first fin structure 210a may include a first portion (e.g., bottom portion) made of the semiconductor substrate 200 and an overlying second portion (e.g., top portion) made of the material layer 202. In those cases, the first portion may be made of silicon (Si) and the second portion may be made of silicon germanium (SiGe). Moreover, second first fin structure 210b may also include a first portion (e.g., bottom portion) made of the semiconductor substrate 200 (e.g., silicon (Si)) and an overlying second portion (e.g., top portion) made of the material layer 202 (e.g., silicon germanium (SiGe)).

In some embodiments, isolation regions may be positioned on opposing sides of the first portion of the first fin structures 210a and opposing sides of the first portion of the second fin structures 210b. In some embodiments, each of the isolation regions includes an isolation feature 214a and a liner layer 212 covering the sidewall and the bottom of the isolation feature 214a, so that the semiconductor substrate 200, the first portion of the first fin structures 210a, and the first portion of the second fin structures 210b are spaced apart from the isolation features 214a by the liner layer 212.

In some embodiments, the liner layer 212 may be made of a nitride-containing material (e.g., silicon nitride (SiN or $Si_3N_4$)) and the isolation features 214a may be made of oxide (e.g., silicon oxide).

In some embodiments, gate structures 225 are respectively positioned over the first fin structures 210a in the first region 200a of the semiconductor substrate 200 and the second fin structures 210b in the second region 200b of the semiconductor substrate 200. In some embodiments, each of the gate structures 225 may include a dummy gate dielectric layer 218 and a dummy gate electrode layer 218. The dummy gate electrode layer 220 is positioned over the dummy gate dielectric layer 218.

Figure 2:
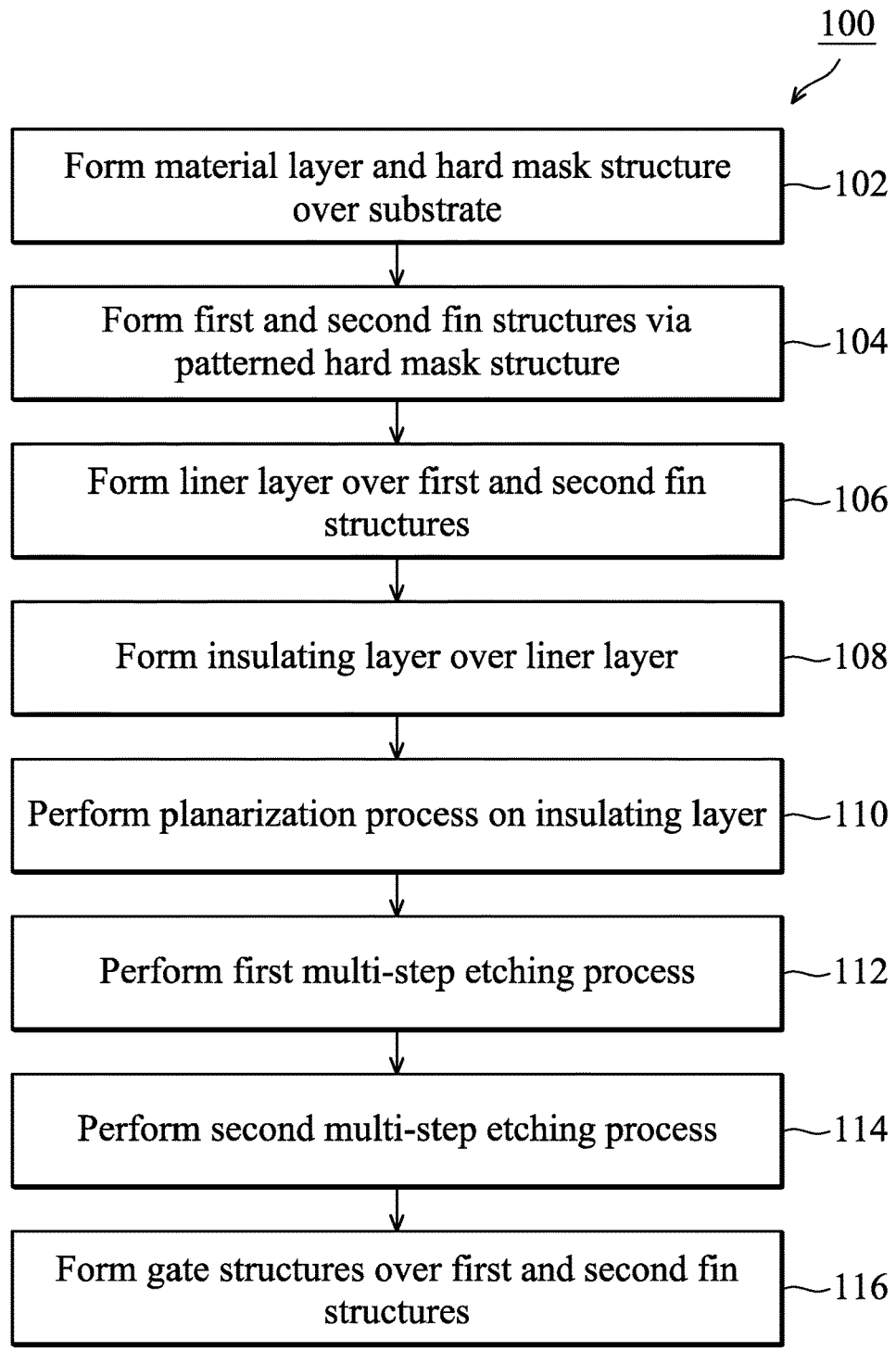
FIG. 2 is a flowchart of an example method of forming a semiconductor device structure with FinFETs, in accordance with some embodiments.

FIG. 2 is a flowchart of a method 100 of forming one or more semiconductor device structures with FinFETs, in accordance with some embodiments. The method 100 is discussed in detail below with reference to a semiconductor device structure, shown in FIGS. 3 through 14 which are cross-sectional views along line a-a' of FIG. 1 to show various stages of a process for forming the semiconductor device structure 300, in accordance with some embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order. In some embodiments, a gate-replacement process is employed to fabricate the semiconductor device structure 300.

Figure 3:
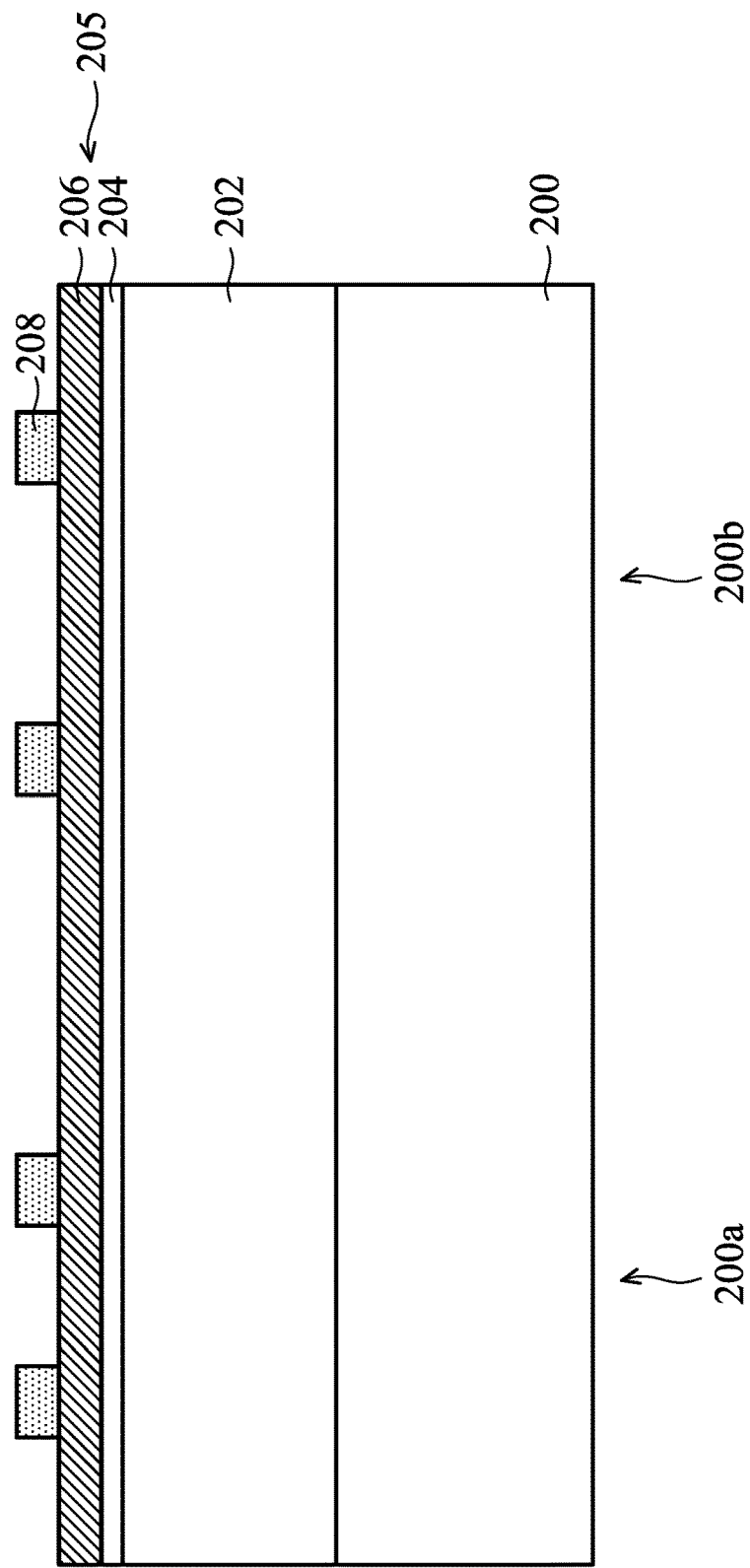
FIG. 3, FIG. 4, FIG. 5, FIG. 6, FIG. 7, FIG. 8, FIG. 9, FIG. 10, FIG. 11, FIG. 12, FIG. 13, and FIG. 14 are cross-sectional views showing various stages of a method of forming a semiconductor device structure with FinFETs, in accordance with some embodiments.

Referring to FIGS. 2 and 3, the method 100 begins at step 102 by forming a material layer 202 over a substrate 200 and forming a hard mask structure 205 over the material layer 202. In some embodiments, a substrate 200 is provided. The substrate 200 includes a first region 200a and a second region 200b. The substrate 200 may be made of silicon or other semiconductor materials. In some embodiments, the substrate 200 is a silicon wafer. Alternatively or additionally, the substrate 200 may include other elementary semiconductor materials such as germanium. In some embodiments, the substrate 200 is made of a compound semiconductor such as silicon carbide, gallium arsenic, indium arsenide, or indium phosphide. In some embodiments, the substrate 200 is made of an alloy semiconductor such as silicon germanium, silicon germanium carbide, gallium arsenic phosphide, or gallium indium phosphide. In some embodiments, the substrate 200 includes an epitaxial layer. For example, the substrate 200 has an epitaxial layer overlying a bulk semiconductor.

In some embodiments, a material layer 202 is formed over the substrate 200. The material layer 202 and the substrate 200 are made of different materials. In some embodiments, the material layer 202 is made of silicon germanium (SiGe). The material layer 202 is formed by an epitaxial process. The epitaxial process may include a selective epitaxy growth (SEG) process, CVD deposition techniques (e.g., vapor-phase epitaxy (VPE) and/or ultra-high vacuum CVD (UHV-CVD)), molecular beam epitaxy, or other suitable epi processes.

Afterwards, a hard mask structure 205 is formed over the material layer 202 and a photoresist layer 208 is formed over the hard mask structure 205. In some embodiments, the hard mask structure 205 includes a pad oxide layer 204 and an overlying masking layer 206. The photoresist layer 208 is patterned by a patterning process. The patterning process may include a photolithography process. The photolithography process includes photoresist coating (e.g., spin-on coating), soft baking, mask aligning, exposure, post-exposure baking, developing the photoresist, rinsing and drying (e.g., hard baking).

The pad oxide layer 204 is a buffer layer between the material layer 202 and the masking layer 206. In addition, the pad oxide layer 204 is used as a stop layer when the masking layer 206 is removed. The pad oxide layer 204 may be made of silicon oxide. The masking layer 206 may be made of silicon nitride or silicon oxynitride. In some other embodiments, more than one masking layer 206 is formed over the pad oxide layer 204.

The pad oxide layer 204 and the masking layer 206 are formed by deposition processes, such as a chemical vapor deposition (CVD) process, a high-density plasma chemical vapor deposition (HDPCVD) process, a spin-on process, a sputtering process, or another applicable process.

Figure 4:
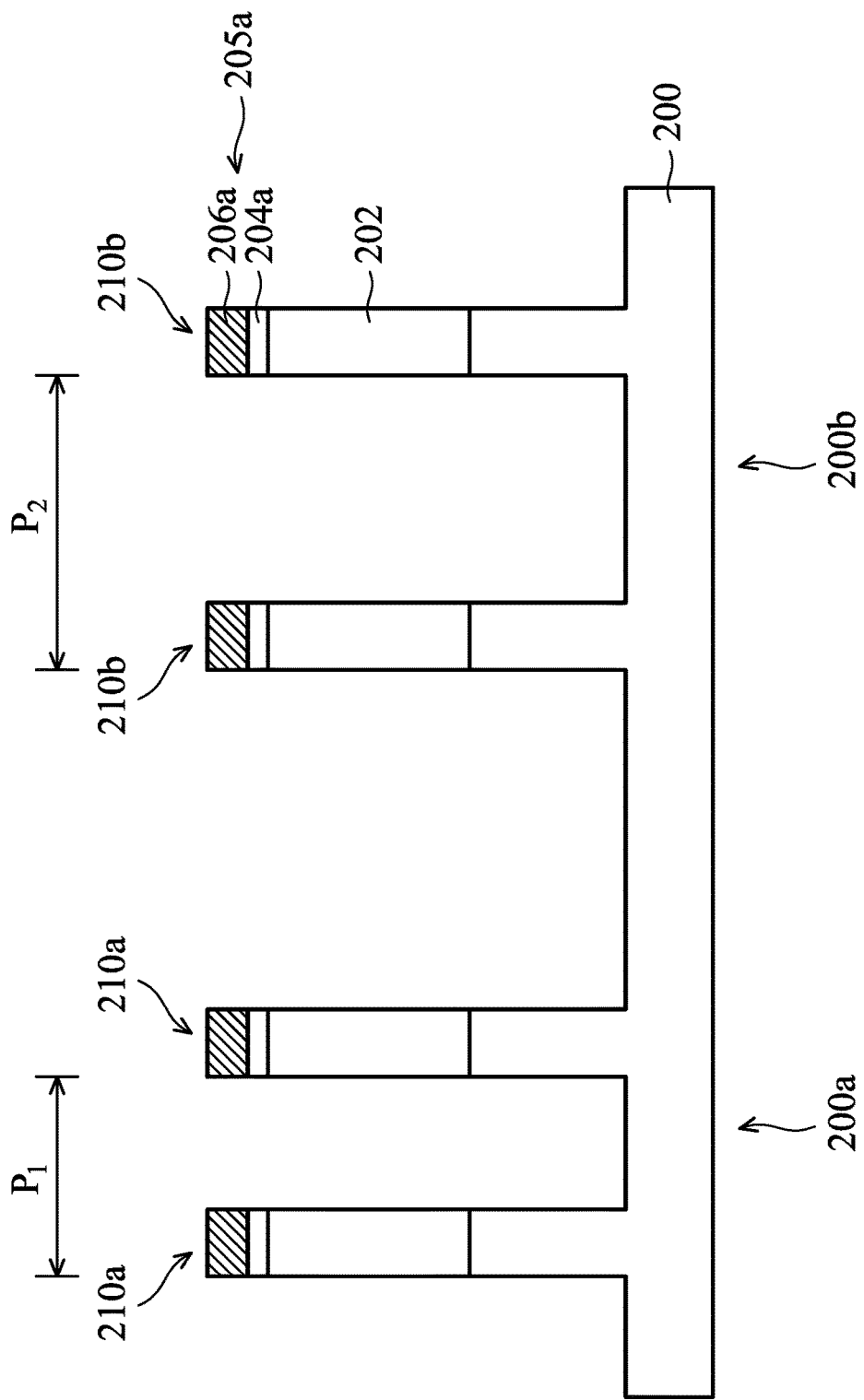

Afterwards, as shown in FIGS. 2 and 4, the method 100 proceeds to step 104 by forming first fin structures 210a in the first region 200a of the substrate 200 and second fin structures 210b in the second region 200b of the substrate 200 via a patterned hard mask structure 205a. In some embodiments, after the photoresist layer 208 is patterned, the pad oxide layer 204 and the overlying masking layer 206 are patterned by an etching process (such as a dry etching process or a wet etching process) using the patterned photoresist layer 208 as an etch mask, in accordance with some embodiments. As a result, the patterned hard mask structure 205a including a patterned pad oxide layer 204aa and a patterned masking layer 206a is obtained. Afterwards, the patterned photoresist layer 208 is removed.

Afterwards, an etching process is performed on the material layer 202 and the substrate 200 to form the first fin structures 210a and the second fin structures 210b using the patterned hard mask structure 205a as an etch mask. The first fin structures 210a are formed in the first region 200a of the substrate 200 and capped by the patterned hard mask structure 205a. The second fin structures 210b are formed in the second region 200b of the substrate 200 and capped by the patterned hard mask structure 205a. A first pitch $P_1$ is between a sidewall surface of the first fin structure 210a and a sidewall surface of the adjacent first fin structure 210a. A second pitch $P_2$ is between a sidewall surface of the second fin structure 210b and a sidewall surface of the adjacent second fin structure 210b. In some embodiments, the second pitch $P_2$ is greater than the first pitch $P_1$. In other words, the width of the space between the adjacent first fin structures 210a is narrower than the width of the space between the adjacent second fin structures 210b. In those cases, the first region 200a is referred to as a dense fin region and the second region 200b is referred to as an isolated fin region. In some embodiments, the first pitch $P_1$ is in a range from about 10 nm to about 40 nm. In some embodiments, the second pitch $P_2$ is in a range from about 20 nm to about 50 nm.

Each of the first and second fin structures 210a and 210b may have a first portion (e.g., bottom portion) and a second portion (e.g., top portion). In some embodiments, the top portion of each of the first and second fin structures 210a and 210b is made of silicon germanium (SiGe), and the bottom portion is made of silicon (Si). The silicon germanium (SiGe) below a gate structure is used as a channel region. The silicon germanium (SiGe) having compressive stress is suitable for providing increased carrier speed, i.e., increased hole carrier speed, for the channel region of a PMOS device (e.g., a P-type FinFET).

In some embodiments, each of the first and second fin structures 210a and 210b has a width that gradually increases from the top portion to the bottom portion, so that each of the first and second fin structures 210a and 210b has a tapered fin width and sidewall.

The etching process may be a dry etching process or a wet etching process. In some embodiments, the substrate 200 is etched using a dry etching process. The dry etching process includes using a fluorine-based etchant gas, such as $SF_6$, $C_xF_y$, $NF_3$ or a combination thereof. The etching process may be a time-controlled process, and continue until the first and second fin structures 210a and 210b reach a predetermined height.

Figure 5:
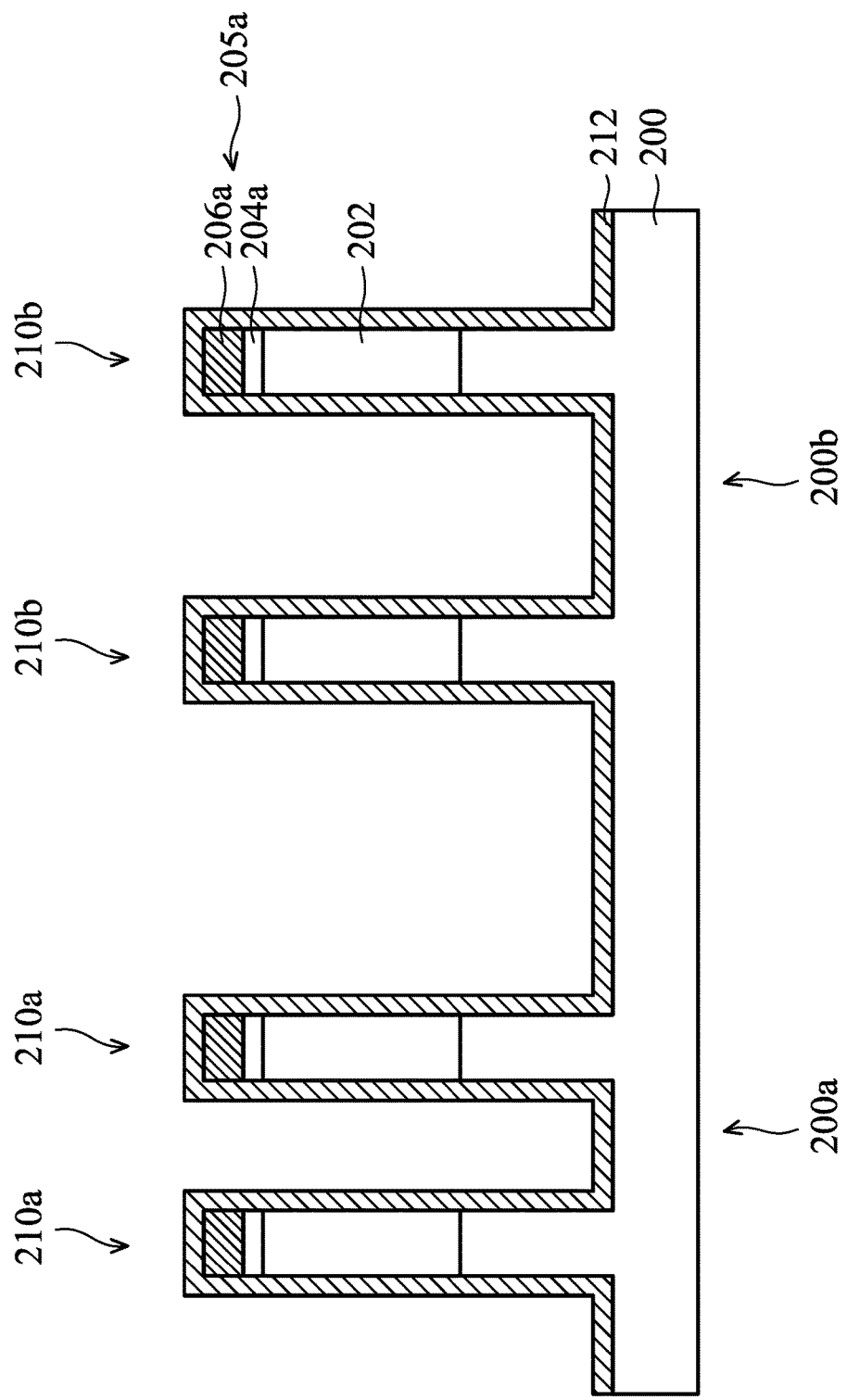

Afterwards, as shown in FIGS. 2 and 5, the method 100 proceeds to step 106 by forming a liner layer 212 over the first and second fin structures 210a and 210b. In some embodiments, after the first and second fin structures 210a and 210b are formed, a liner layer 212 is formed in each space between the adjacent first fin structures 210a, each space between the adjacent second fin structures 210b, and a space between the adjacent first and second fin structures 210a and 210b, respectively. More specifically, the liner layer 212 is conformally formed over the sidewall surfaces of the first and second fin structures 210a and 210b and the patterned hard mask structure 205a, and over the top surface of the patterned masking layer 206a.

The liner layer 212 protects the first and second fin structures 210a and 210b from being damaged by the following processes (e.g., a steam annealing process or an etching process). Therefore, the profiles or shapes of the first and second fin structures 210a and 210b are maintained or preserved by the protection of the liner layer 212.

In some embodiments, the liner layer 212 is made of nitride (e.g., silicon nitride), rather than oxide (e.g., silicon oxide). If the liner layer 212 made of silicon oxide and the material layer 202 is made of silicon germanium (SiGe), the first and second fin structures 210a and 210b that include the material layer 202 is easily oxidized to form germanium oxide (GeOx) during the subsequent annealing process. The germanium oxide (GeOx) is easily removed by the etching process, so that the profiles or shape of the first and second fin structures 210a and 210b will be changed.

Figure 6:
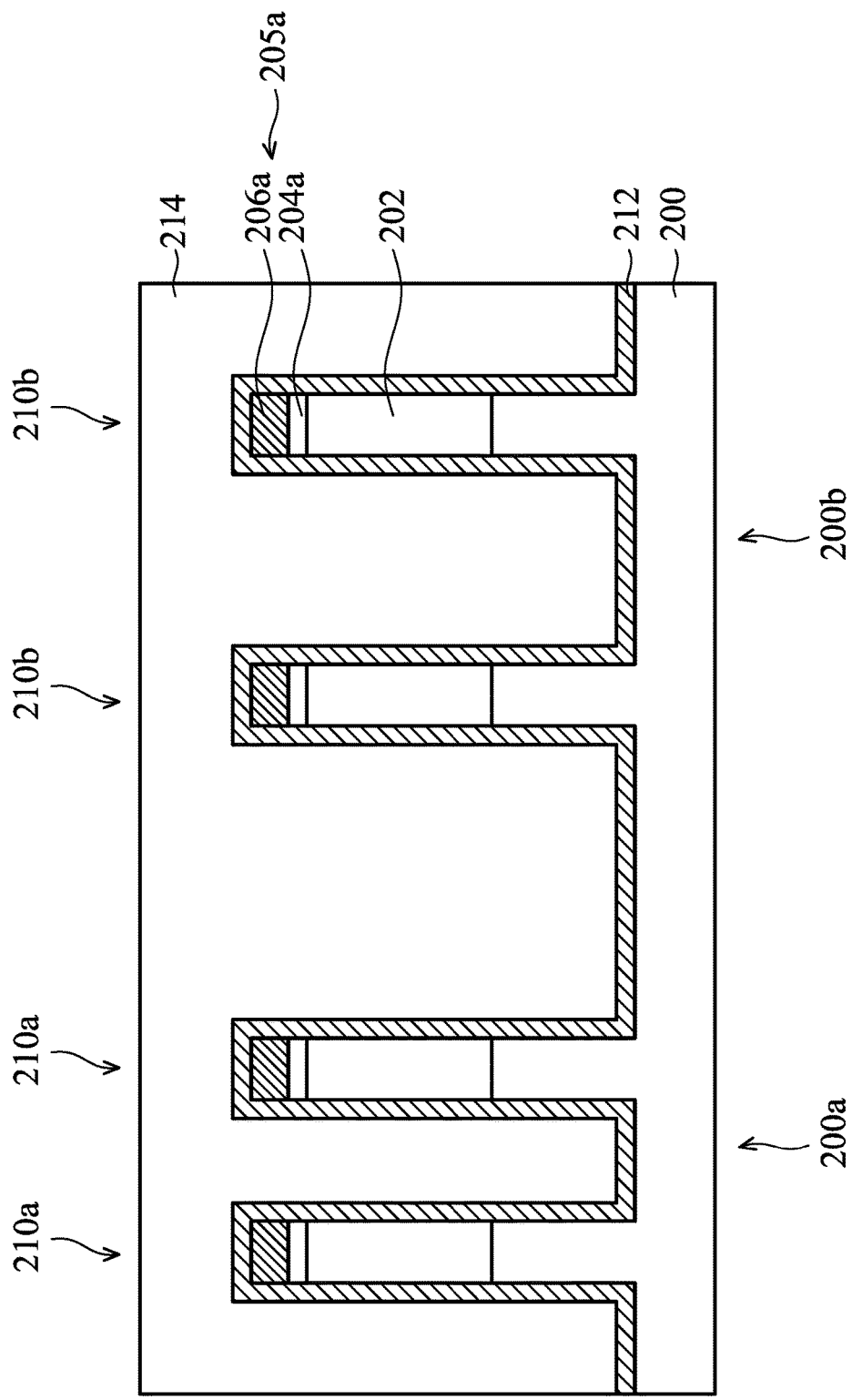

Afterwards, as shown in FIGS. 2 and 6, the method 100 proceeds to step 108 by forming an insulating layer 214 over the liner layer 212. In some embodiments, an insulating layer 214 is formed in each space between the adjacent first fin structures 210a, each space between the adjacent second fin structures 210b, and a space between the adjacent first and second fin structures 210a and 210b, respectively, and covers the patterned hard mask structure 205a over the first and second fin structures 210a.

In some embodiments, the insulating layer 214 is made of oxide (e.g., silicon oxide). In some embodiments, the insulating layer 214 is made of fluoride-doped silicate glass (FSG), or another low-k dielectric material. The insulating layer 214 may be deposited by a deposition process, such as a chemical vapor deposition (CVD) process, a spin-on-glass process, or another suitable process.

In some embodiments, the insulating layer 214 is formed by a flowable chemical vapor deposition (FCVD) process. The insulating layer 214 is solidified by a UV curing process. Afterwards, an annealing process (e.g., a steam annealing process) is performed on the insulating layer 214 to improve the quality of the insulating layer 214. In some embodiments, the annealing process is performed at a temperature in a range from about 400 degrees to about 700 degrees, for a duration of about one hour to about two hours. In some embodiments, the patterned masking layer 206a and the liner layer 212 are made of nitride (e.g., silicon nitride), so that both are used to protect the material layer 202 from being oxidized during the annealing process.

Figure 7:
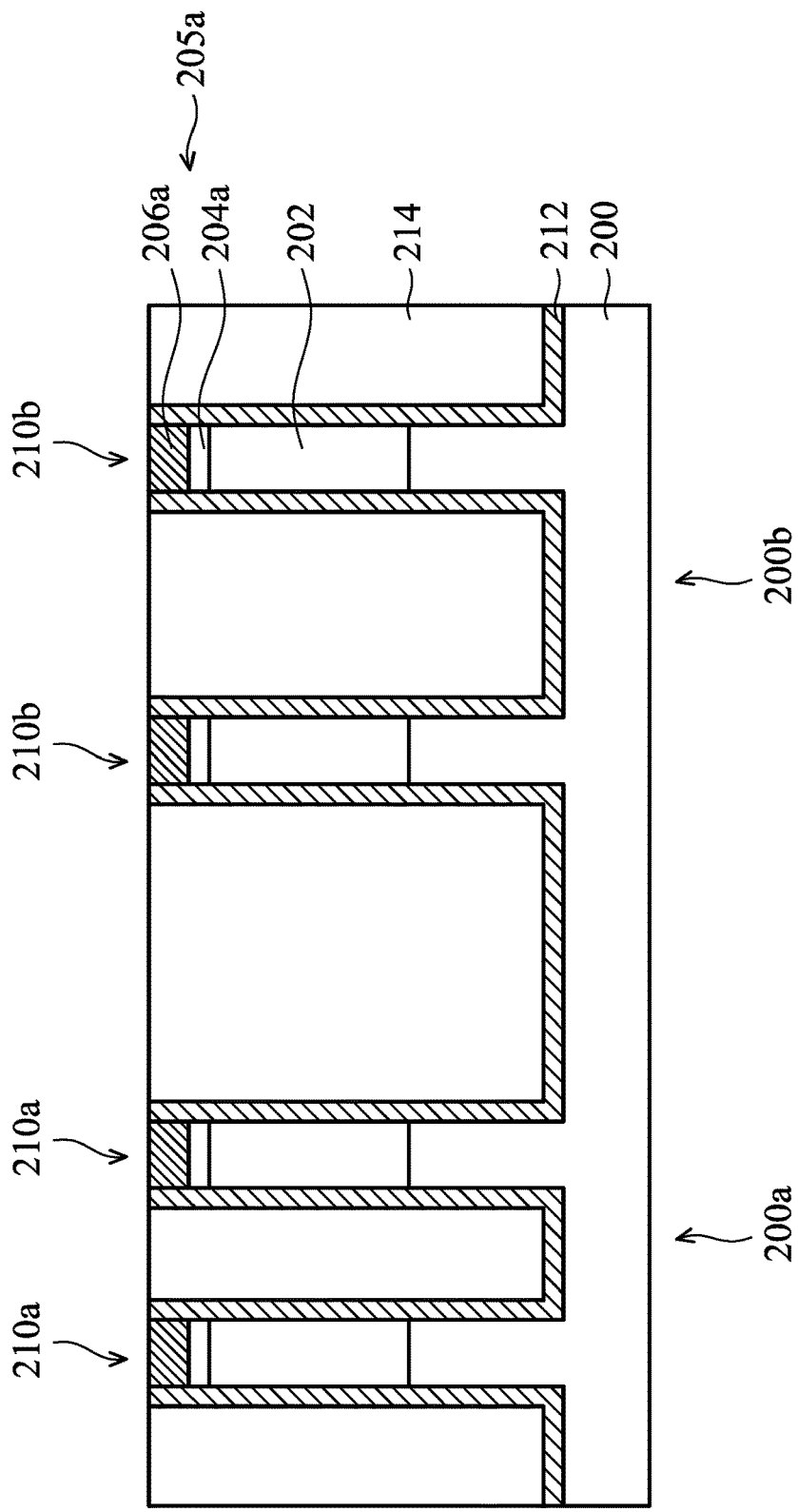

Afterwards, as shown in FIGS. 2 and 7, the method 100 proceeds to step 110 by performing a planarization process on the insulating layer 214 to expose the patterned masking layer 206a of the patterned hard mask structure 205. After the insulating layer 214 is formed, the insulating layer 214 is thinned or planarized to expose the top surface of the patterned masking layer 206a, in accordance with some embodiments. In some embodiments, the insulating layer 214 is thinned by a chemical mechanical polishing (CMP) process.

Figure 8:
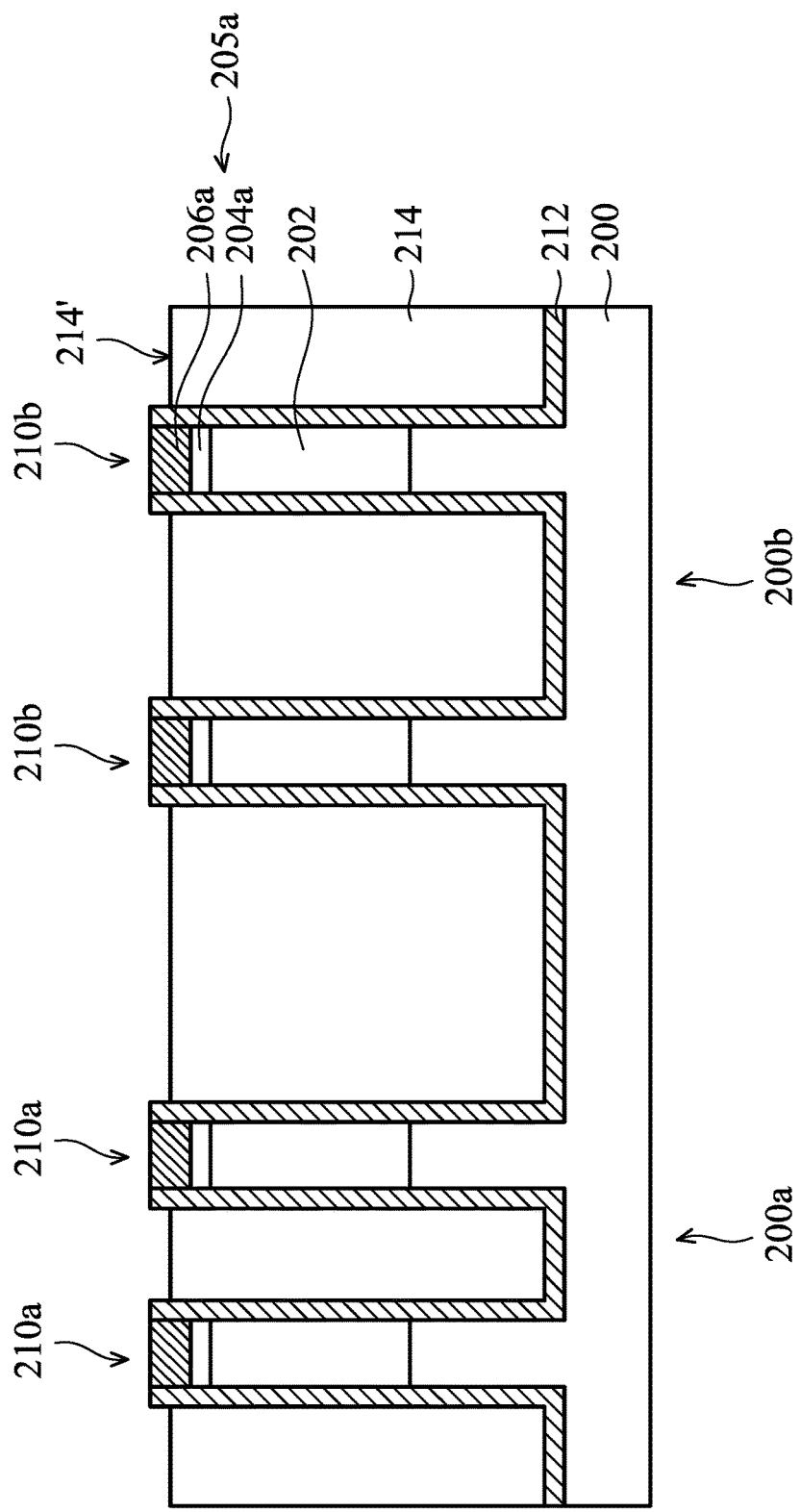
Figure 9:
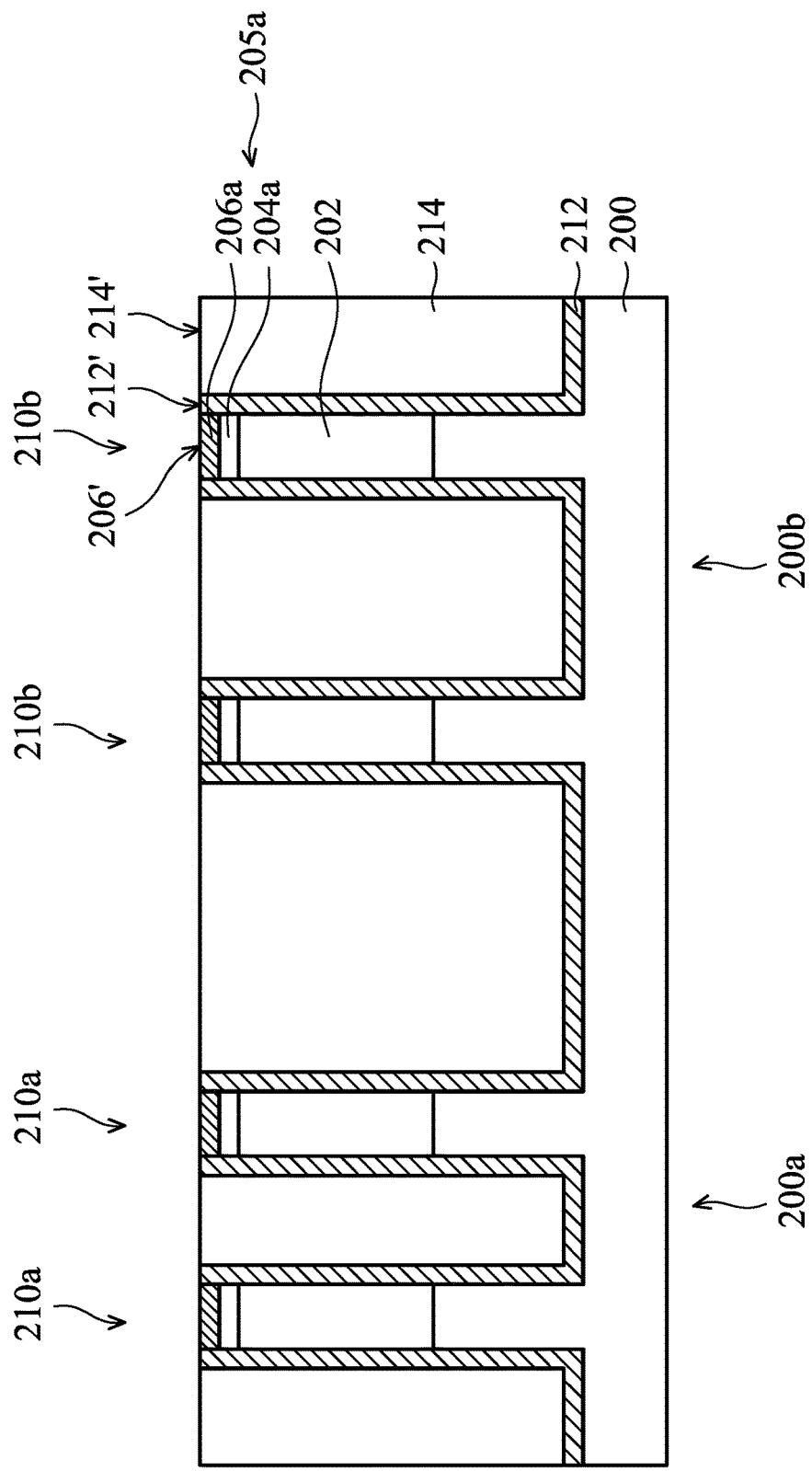

Afterwards, as shown in FIGS. 8 and 9, the insulating layer 214 and the patterned hard mask structure 205a may be optionally and successively recessed by etching processes, in accordance with some embodiments. In some embodiments, a portion of the insulating layer 214 including silicon oxide is removed by a wet etching process using dilute hydrogen fluoride (DHF) etching solution, in accordance with some embodiments. As a result, a top surface 214' of the recessed insulating layer 214 is lower than that of the patterned hard mask structure 205a, so that a top surface of the patterned masking layer 206a and a portion of the liner layer 212 are exposed, as shown in FIG. 8. In some other embodiments, the insulating layer 214 is recessed by a dry etching process using HF or $NF_3$ based gas.

Afterwards, as shown in FIG. 9, a portion of the patterned masking layer 206a and the exposed portion of the liner layer 212 are removed, in accordance with some embodiments. In some embodiments, a portion of the patterned masking layer 206a and the exposed portion of the liner layer 212 including nitride are removed by a wet etching process using a phosphoric acid ($H_3PO_4$) etching solution. As a result, the top surface 214' of the recessed insulating layer 214 is substantially level to the top surface 206' of the recessed patterned masking layer 206a and the top surface 212' of the recessed liner layer 212. The etching process may be a time-controlled process, and continue until the patterned masking layer 206a reach a predetermined thickness.

Afterwards, a first multi-step etching process is performed on the structure shown in FIG. 9, in accordance with some embodiments. In some other embodiments, after the structure shown in FIG. 7 is completed, the first multi-step etching process is performed on the structure shown in FIG. 7. In other words, the optional process steps shown in FIGS. 8 and 9 may be eliminated.

As shown in FIGS. 2, 10, 11, and 12, the method 100 proceeds to step 112 by performing the first multi-step etching process on the structure shown in FIG. 7 or 9. In some embodiments, the first multi-step etching process is a dry etching process including a number of etching steps (such as a first step 10a shown in FIG. 10, a second step 10b shown in FIG. 11, and a third step 10c shown in FIG. 12) and uses a process gas including a first etching gas (e.g., a hydrogen fluoride (HF) gas), a second etching gas (e.g., an ammonia ($NH_3$) gas), and a dilute gas including nitrogen ($N_2$), argon (Ar), or a combination thereof. In those cases, the process gas is not excited in a plasma state. In other words, in the first multi-step etching process, plasma is not turned on. The first multi-step etching process is non-plasma based etching process which uses spontaneous reaction of reactive gas mixture (such as a mixture of HF gas and $NH_3$ gas). It should be noted that if the process gas is operated at the plasma state, the first and second fin structures 210a and 210b may be damaged, so that the profile and shape of the first and second fin structures 210a and 210b may be destroyed.

Figure 10:
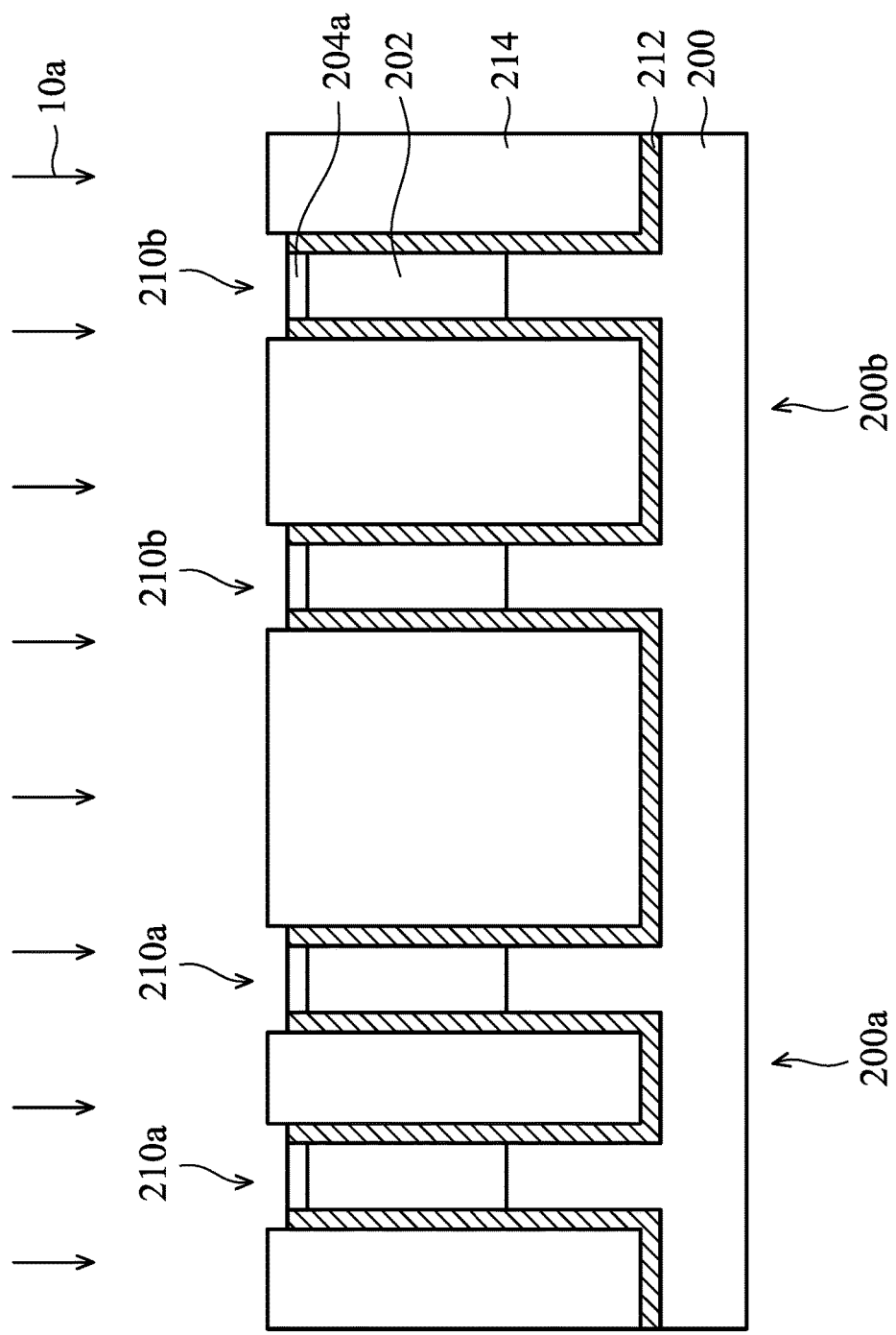

In some embodiments, the first step 10a of the first multi-step etching process is performed to selectively remove the patterned masking layer 206a of the patterned hard mask structure 205a and a portion of the liner layer 212 above the patterned pad oxide layer 204a of the patterned hard mask structure 205a, as shown in FIG. 10. In some embodiments, the first step 10a of the first multi-step etching process operated at a pressure in a range from about 2000 mTorr to about 3000 mTorr. In some embodiments, the first step 10a of the first multi-step etching process is operated at a temperature in a range from about 90 degrees to about 110 degrees for a period of time in a range from about 8 second to about 20 seconds. When the pressure, the temperature, and the time of the first step 10a of the first multi-step etching process are kept within the range mentioned above, the etching efficiency of the first step 10a is improved.

In some embodiments, the flow rate of the first etching gas is different from that of the second etching gas in the first step 10a. The etching rates of the patterned hard mask structure 205a, the liner layer 212, and the insulating layer 214 are controlled by adjusting the flow rates of the first and second etching gases. For example, the flow rate of the first etching gas is in a range from about 400 sccm to 600 sccm, and the flow rate of the second etching gas is in a range from about 50 sccm to 150 sccm. Since the flow rate of the first etching gas is greater than that of the second etching gas in the first step 10a, the etching rate of nitride is faster than that of oxide. As a result, the patterned masking layer 206a of the patterned hard mask structure 205a and a portion of the liner layer 212 above the patterned pad oxide layer 204a of the patterned hard mask structure 205a are selectively removed, as shown in FIG. 10.

Figure 11:
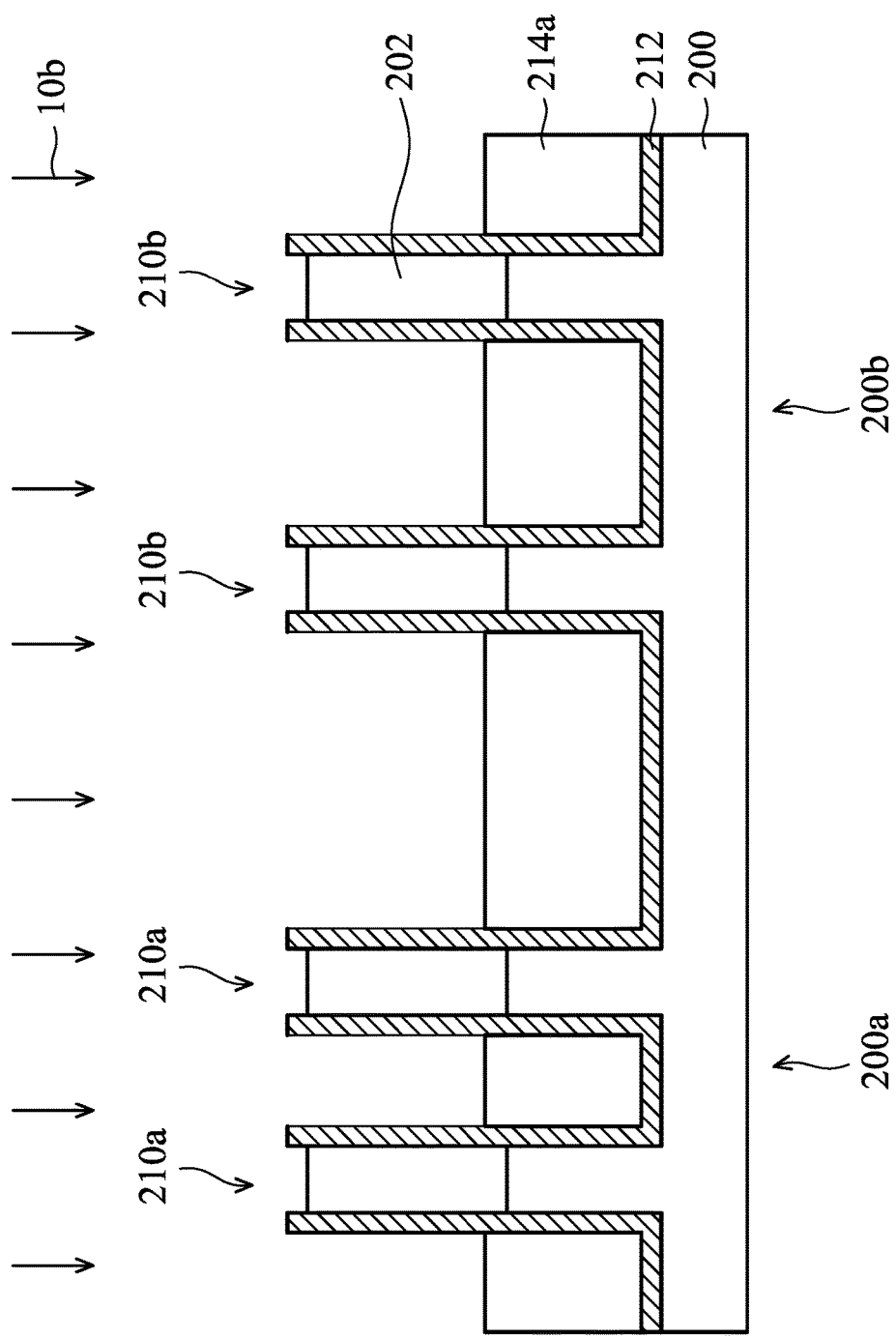

In some embodiments, the second step 10b of the first multi-step etching process is performed to in-situ and selectively remove a portion of the insulating layer 214 in each space between the adjacent first fin structures 210a, each space between the adjacent second fin structures 210b and the space between the first and second fin structures 210a and 210b, respectively, so as to form isolation features 214a in those spaces, as shown in FIG. 11. In some embodiments, the second step 10b of the first multi-step etching process operated at a pressure in a range from about 1000 mTorr to about 1000 mTorr. In some embodiments, the second step 10b of the first multi-step etching process is operated at a temperature in a range from about 90 degrees to about 110 degrees for a period of time in a range from about 8 second to about 20 seconds. When the pressure, the temperature, and the time of the second step 10b of the first multi-step etching process are kept within the range mentioned above, the etching efficiency of the second step 10b is improved.

In some embodiments, the flow rate of the first etching gas is also different from that of the second etching gas in the second step 10b. The etching rates of the patterned pad oxide layer 204a, the liner layer 212, and the insulating layer 214 are controlled by adjusting the flow rates of the first and second etching gases. For example, after performing the first step 10a, the flow rate of the first etching gas is reduced and in a range from about 30 sccm to 70 sccm, and the flow rate of the second etching gas is increased and in a range from about 350 sccm to 250 sccm. Since the flow rate of the first etching gas is less than that of the second etching gas in the second step 10b, the etching rate of nitride is lower than that of oxide. As a result, the patterned pad oxide layer 204a of the patterned hard mask structure 205a is selectively and entirely removed. Moreover, a portion of the insulating layer 214 in each space between the adjacent first fin structures 210a, each space between the adjacent second fin structures 210b and the space between the first and second fin structures 210a and 210b, respectively, is also selectively removed to form isolation features 214a in those spaces, as shown in FIG. 11.

During the second step 10b, the insulating layer 214 is firstly etched to form the isolation features 214a. As a result, the stress from the insulating layer 214 may be reduced and the liner layer 212 may simultaneously provide protection for the first fin structures 210a and the second fin structures 210b. Accordingly, the first fin structures 210a and the second fin structures 210b can be prevented from bending or collapsing.

In some embodiments, the third step 10c of the first multi-step etching process is performed to in-situ and selectively remove a portion of the liner layer 212 above the isolation feature 214a in each space between the adjacent first fin structures 210a, each space between the adjacent second fin structures 210b and the space between the first and second fin structures 210a and 210b, respectively, as shown in FIG. 11. In some embodiments, the third step 10c of the first multi-step etching process operated at a pressure in a range from about 2000 mTorr to about 3000 mTorr. In some embodiments, the third step 10c of the first multi-step etching process is operated at a temperature in a range from about 90 degrees to about 110 degrees for a period of time in a range from about 8 second to about 20 seconds. When the pressure, the temperature, and the time of the third step 10c of the first multi-step etching process are kept within the ranges mentioned above, the etching efficiency of the third step 10c is improved.

Figure 12:
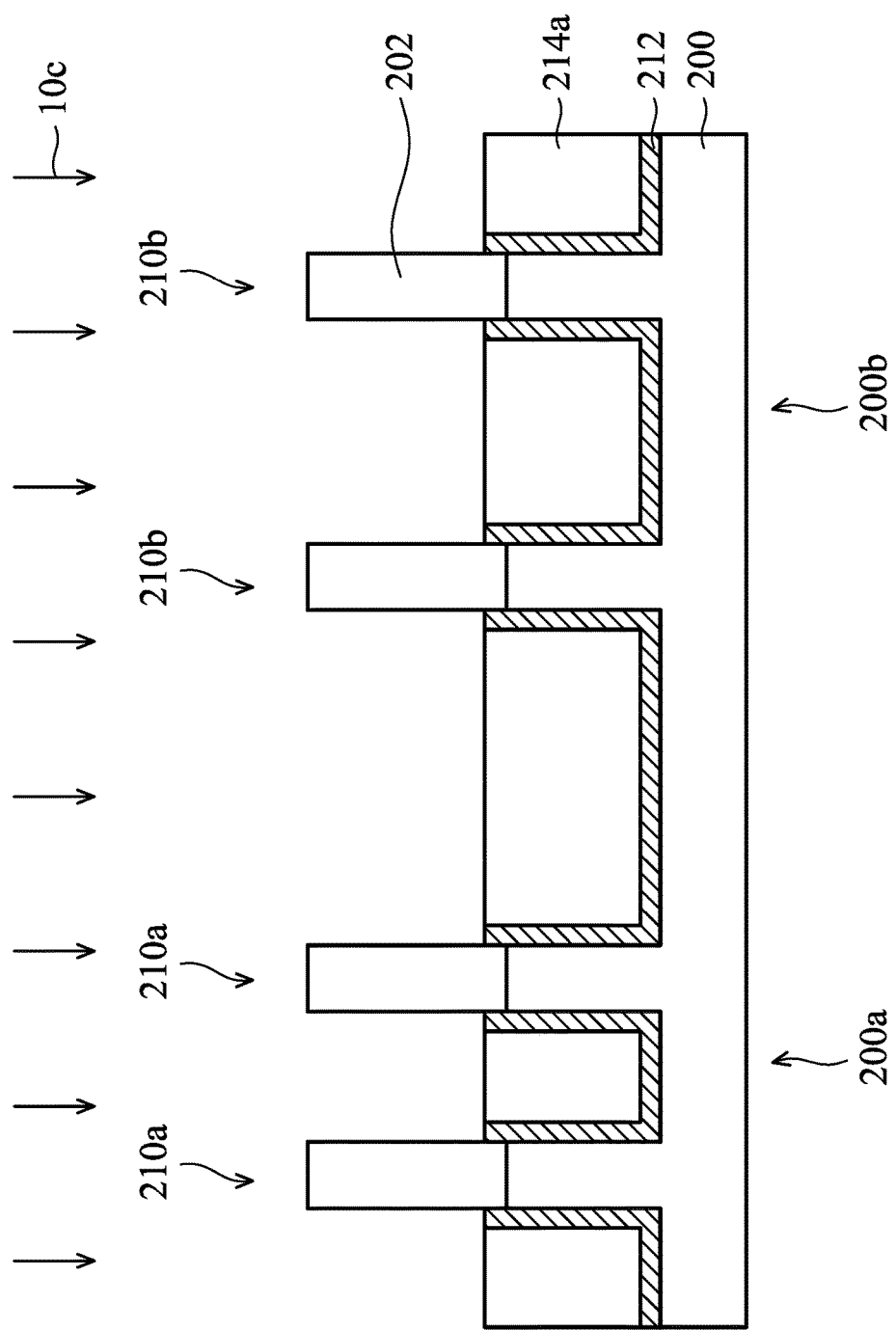

In some embodiments, the flow rate of the first etching gas is also different from that of the second etching gas in the third step 10c. The etching rates of the liner layer 212 and the isolation feature 214a are controlled by adjusting the flow rates of the first and second etching gases. For example, after performing the second step 10b, the flow rate of the first etching gas is increased and in a range from about 400 sccm to 600 sccm, and the flow rate of the second etching gas is reduced and in a range from about 50 sccm to 150 sccm. Since the flow rate of the first etching gas is greater than that of the second etching gas in the third step 10c, the etching rate of nitride is faster than that of oxide. As a result, a portion of the liner layer 212 above the isolation feature 214a is selectively removed, as shown in FIG. 12.

Figure 13:
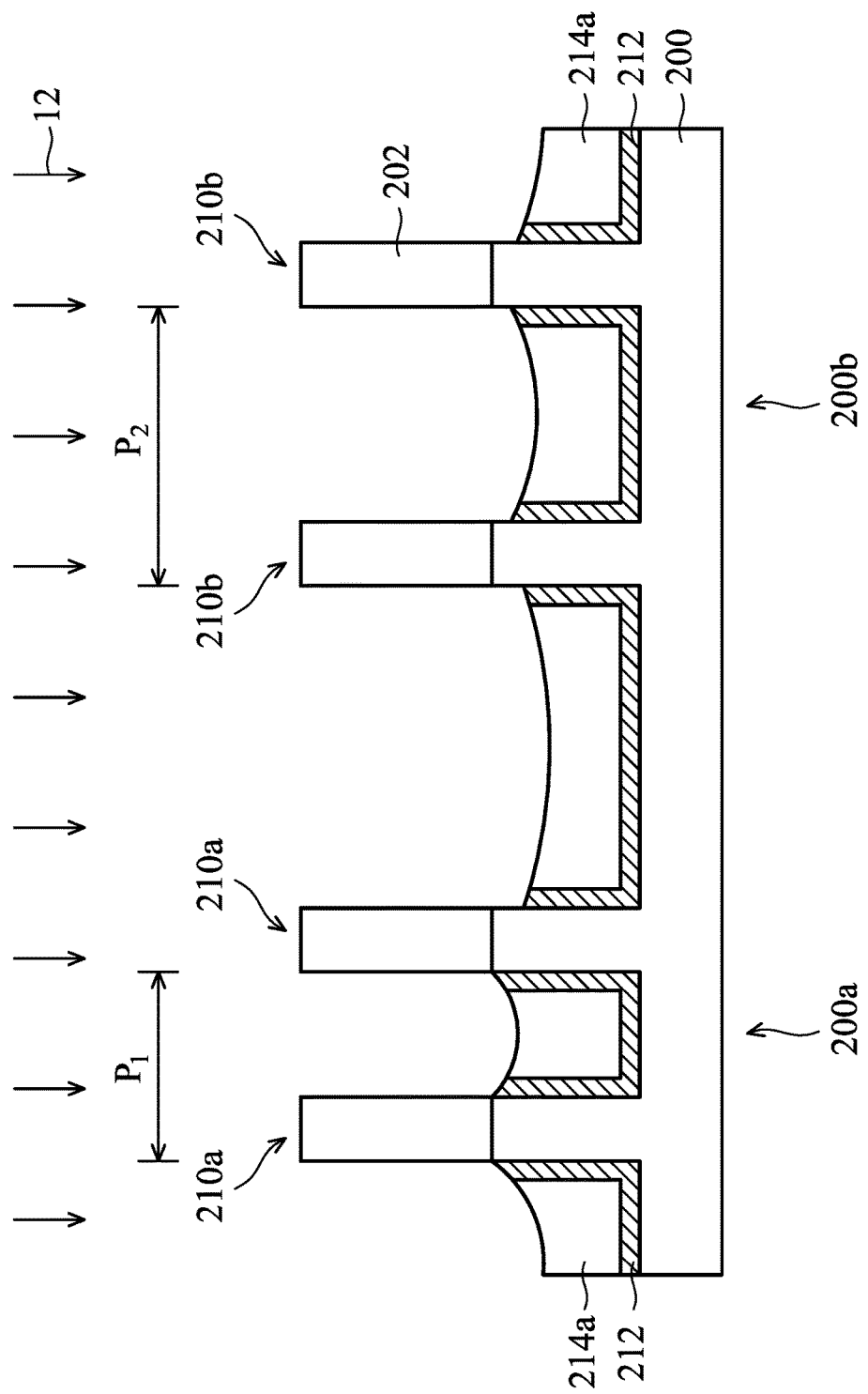

As shown in FIGS. 2 and 13, the method 100 proceeds to step 114 by performing a second multi-step etching process 12 on the liner layer 212 and the isolation feature 214a. In some embodiments, the second multi-step etching process 12 is used to remove a portion of the liner layer 212 and a portion of the isolation feature 214a in each space between the adjacent first fin structures 210a, each space between the adjacent second fin structures 210b, and the space between the adjacent first and second fin structures 210a and 210b, respectively. As a result, the liner layer 212 in each space between the adjacent first fin structures 210a has a height that is different from that of the liner layer 212 in each space between the adjacent second fin structures 210b and that of the liner layer 212 in the space between the adjacent first and second fin structures 210a and 210b. In addition, the isolation feature 214a in each space between the adjacent first fin structures 210a has a height that is different from that of the isolation feature 214a in each space between the adjacent second fin structures 210b and that of the isolation feature 214a in the space between the adjacent first and second fin structures 210a and 210b.

In some embodiments, the top surface of the liner layer 212 in the space between the adjacent first fin structures 210a is higher than the top surface of the liner layer 212 in the space between the adjacent second fin structures 210b. Moreover, the top surface of the liner layer 212 in the space between the adjacent second fin structures 210b is higher than the top surface of the liner layer 212 in the space between the adjacent first and second fin structures 210a and 210b.

Similarly, the top surface of the isolation feature 214a in the space between the adjacent first fin structures 210a is higher than the top surface of the isolation feature 214a in the space between the adjacent second fin structures 210b. Moreover, the top surface of the isolation feature 214a in the space between the adjacent second fin structures 210b is higher than the top surface of the isolation feature 214a in the space between the adjacent first and second fin structures 210a and 210b. Furthermore, the top surface of the liner layer 212 is higher than the top surface of the corresponding isolation feature 214.

From the above descriptions, when the distance of the two adjacent fin structures is decreased, the height of the liner layer and that of the isolation feature are increased. For example, the first pitch $P_1$ between the adjacent first fin structures 210a is smaller than the second pitch $P_2$ between the adjacent second fin structures 210b. The height of the liner layer 212 and the height of the isolation feature 214a in the space between the adjacent first fin structures 210a are higher than the liner layer 212 and the height of the isolation feature 214a in the space between the adjacent second fin structures 210b.

It should be noted that if the heights of the liner layer 212 in those spaces are equal to each other, the first and second fin structures 210a and 210b will be bent due to the uneven stress. In order to avoid fin bending, the height of the liner layer 212 in the space between the adjacent first fin structures 210a is controlled via the second multi-step etching process 12, so as to be higher than that of the liner layer 212 in the space between the adjacent second fin structures 210b or in the space between the adjacent first and second fin structures 210a and 210b.

In some embodiments, the second multi-step etching process 12 includes a dry etching process. The dry etching process includes multiple etching steps (or operations). In some embodiments, the second multi-step etching process 12 is performed using a process gas that is the same as that used in the first multi-step etching process, and the process gas used in the second multi-step etching process 12 is also not excited in a plasma state. For example, the process gas of the second multi-step etching process 12 includes a first etching gas (e.g., HF gas), a second etching gas (e.g., $NH_3$ gas), and a dilute gas (e.g., $N_2$, Ar, or a combination thereof). The etching rates of the liner layer 212 and the isolation feature 214a are controlled by adjusting the flow rates of the HF gas and $NH_3$ gas. It should be noted that if the process gas is operated at the plasma state, the first and second fin structures 210a and 210b may be damaged, so that the profile and shape of the first and second fin structures 210a and 210b may be destroyed.

During the second multi-step etching process 12, the isolation feature 214a (e.g. oxide layer) are mainly removed by $NH_3$ gas, and the liner layer 212 (e.g. silicon nitride) are mainly removed by HF gas. By increasing the flow rate of $NH_3$ gas (or decreasing the flow rate of HF gas) in the second multi-step etching process 12, the amount of the liner layer 212 in the space between the adjacent first fin structures 210a that is removed is less than that of the liner layer 212 in the space between the adjacent second fin structures 210b. Moreover, the amount of the liner layer 212 in the space between the adjacent second fin structures 210b that is removed is less than or that of the liner layer 212 in the space between the adjacent first and second fin structures 210a and 210b.

In some embodiments, the second multi-step etching process 12 includes a number of etching steps and a cleaning step is between two etching steps. In some embodiments, a first etching step is performed for a period of time in a range from about 1 second to about 30 seconds, a cleaning step is performed after the first etching step for a period of time in a range from about 60 second to about 300 seconds, and a second etching step is performed after the cleaning step. Note that during the cleaning step, the etching gas is stopped. The cleaning step is used to remove the unwanted residues and byproducts generated from the etching steps. The cleaning step is performed in-situ without transferred to another chamber. Therefore, pollution is avoided and throughput is improved.

In some embodiments, the second multi-step etching process 12 is operated at a pressure in a range from about 1 torr to about 5 torr. In some embodiments, the second multi-step etching process 12 is operated at a temperature in a range from about 100 degrees to about 150 degrees. When the pressure and the temperature of the second multi-step etching process 12 are kept within the range mentioned above, the etching efficiency of the second multi-step etching process 12 is improved and the first and second fin structures 210a and 210b are not oxidized or damaged.

Figure 14:
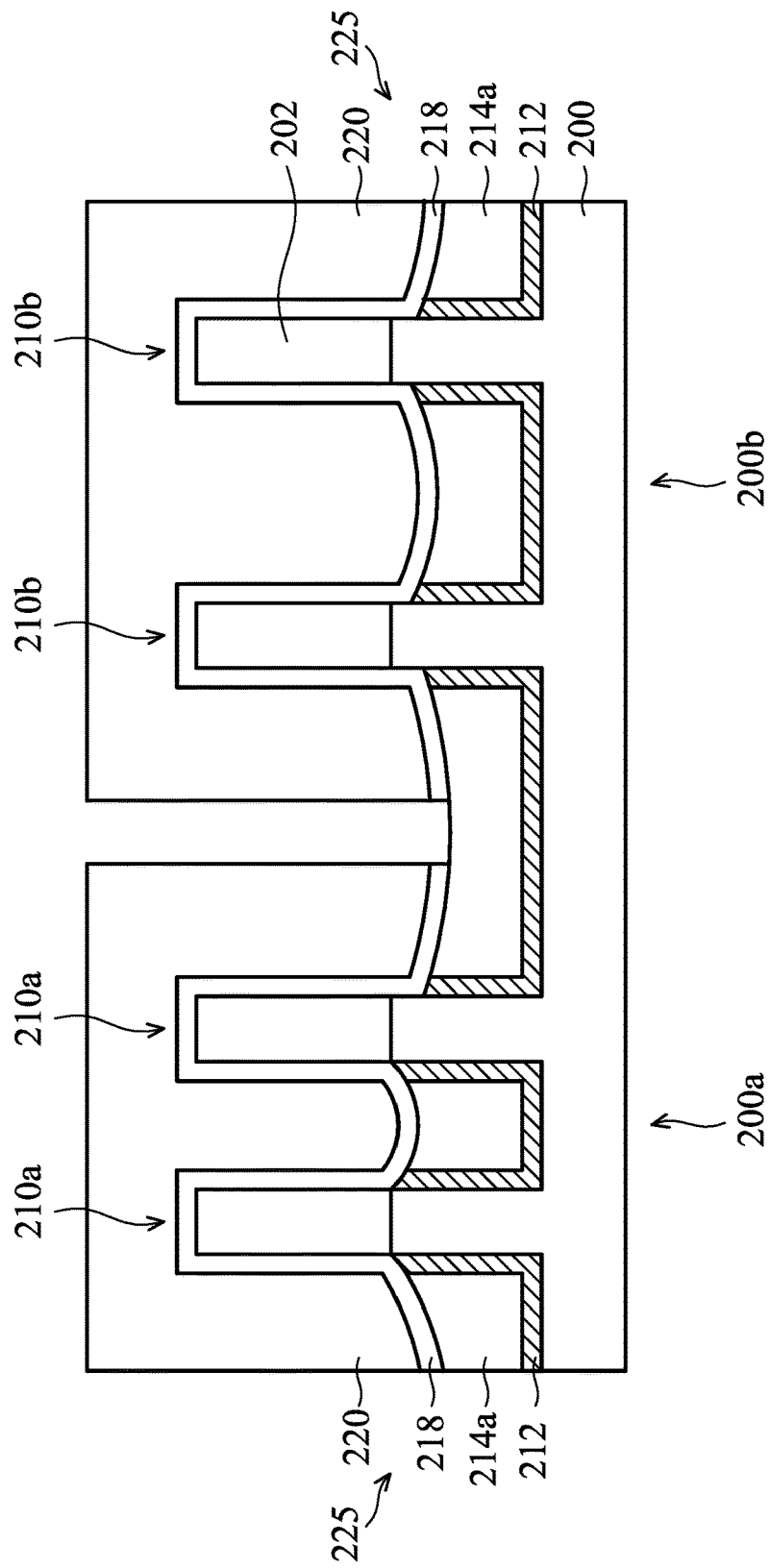

Afterwards, as shown in FIGS. 2 and 14, the method 100 proceeds to step 116 by forming a gate structure 225 over the first fin structures 210a in the first region 200a and a gate structure 225 over the second fin structures 210b in the second region 200b, respectively. In some embodiments, after performing the second multi-step etching process 12, gate dielectric layers 218 are formed over the first fin structures 210a and the isolation features 214a in the first region 200a and the second fin structures 210b and the isolation features 214a in the second region 200b, respectively. Afterwards, gate electrode layers 220 are correspondingly formed over the gate dielectric layers 218, in accordance with some embodiments. Each gate structure 225 is constructed by the gate dielectric layer 218 and the gate electrode layer 220.

In some embodiments, the gate dielectric layer 218 is a dummy gate dielectric layer and the gate electrode layer 220 is a dummy gate electrode layer. The dummy gate dielectric layer and the dummy gate electrode layer may be replaced by the following steps to form a real gate structure with a high-k dielectric layer and a metal gate electrode layer.

In some embodiments, the gate dielectric layer 218 may include dielectric materials, such as silicon oxide, silicon nitride, silicon oxynitride, dielectric material(s) with high dielectric constant (high-k), or combinations thereof. In some embodiments, the gate electrode layer 220 is made of polysilicon. The gate dielectric layer 218 and the gate electrode layer 220 are independently formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

Afterwards, two spacer layers (not shown) are respectively formed on opposite sidewalls of the gate structure 225, in accordance with some embodiments. The spacer layers may be made of silicon oxide, silicon nitride, silicon oxynitride, and/or dielectric materials. In some embodiments, the spacer layers are formed by a chemical vapor deposition (CVD) process, a spin-on-glass process, or another applicable process.

In some embodiments, top portions of the first and second fin structures 210a and 210b uncovered by the gate structures 225 are removed to form recesses (not shown), and the source/drain (S/D) structures (not shown) are formed in those recess. The source/drain (S/D) structures are formed on opposite sidewall surfaces of the gate structure 225.

Afterwards, an inter-layer dielectric (ILD) material (not shown) is formed over the first and second fin structures 210a and 210b, and over the gate structures 225. Afterwards, the ILD material is planarized to form the ILD structure.

After the ILD structure is formed, the dummy gate dielectric layer 218 and the dummy gate electrode layer 220 may be removed to form a trench, and the real gate dielectric layer and metal gate electrode layer (not shown) are filled into the trench. In some embodiments, the gate dielectric layer includes silicon oxide, silicon nitride, or a high-k dielectric material including a metal oxide or a silicate of Hf, Al, Zr, La, Mg, Ba, Ti, Pb, or a combination thereof. The formation methods of gate dielectric layer may include CVD, ALD, PECVD, and the like. In some embodiments, the gate electrode layer may be made of a metal-containing material such as TiN, TaN, TaC, Co, Ru, Al, combinations thereof, or multi-layers thereof, and may be formed by, e.g., electroplating, electroless plating, or other suitable method. In some embodiments, a work function layer (not shown) may be formed between the gate dielectric layer and the gate electrode layer.

Embodiments of a semiconductor device structure and a method for forming the same are provided. First and second fin structures respectively protrude from a first region (e.g., a dense fin region) and a second region (e.g., an isolated fin region) of a semiconductor substrate, and are capped by a patterned hard mask structure. A liner layer and an insulating layer that are formed between the adjacent fin structures, the adjacent second fin structures, and the adjacent first and second fin structures, and the patterned hard mask structure are etched by performing a first multi-step etching process followed by a second multi-step etching process, so as to form isolation features. As a result, the top surfaces of the liner layer and the isolation feature in the space between the adjacent first fin structures are higher than those in the space between the adjacent second fin structures, and the top surfaces of the liner layer and the isolation feature in the space between the adjacent second fin structures are higher than those in the space between the adjacent first and second fin structures.

According to the foregoing embodiments, since the liner layer, the insulating layer, and the patterned hard mask structure can be etched by adjusting the flow rates of the first and second etching gases of the process gas are adjusted in each step of the first multi-step etching process, the formation of the isolation feature can be simplified. Moreover, since the process gas used in the first and second multi-step etching processes are not excited in a plasma state, the first and second fin structures can be prevented from being damaged, so as to prevent the profile and shape of the first and second fin structures from being destroyed.

According to the foregoing embodiments, during the second step of the multi-step etching process of removing the insulating layer to form an isolation feature, the stress from the insulating layer is reduced and the liner layer simultaneously provides protection for the first and second fin structures, thereby preventing those fin structures from bending or collapsing.

According to the foregoing embodiments, since the height of the liner layer and the height of the isolation feature in the space between the adjacent first fin structures are controlled via the second multi-step etching process so as to be higher than those in the space between the adjacent second fin structures, fin bending due to uneven stress between the dense fin region and the isolated fin region can be mitigated or avoided.

In some embodiments, a method for forming a semiconductor device structure is provided. The method includes providing a substrate having a first fin structure and a second fin structure that are capped by a patterned hard mask structure. The method also includes forming a liner layer and an overlying insulating layer between the first fin structure and the second fin structure. The method also includes performing a multi-step etching process using a process gas comprising a first etching gas and a second etching gas. The multi-step etching process includes a first step of selectively removing the patterned hard mask structure and a second step of in-situ and selectively removing a portion of the insulating layer to form an isolation feature. A first flow rate of the first etching gas is greater than that of the second etching gas in the first step and a second flow rate of the first etching gas is less than that of the second etching gas in the second step.

In some embodiments, a method for forming a semiconductor device structure is provided. The method includes providing a substrate having a first fin structure and a second fin structure that are capped by a patterned hard mask structure. The method also includes forming a liner layer and an overlying insulating layer between the first fin structure and the second fin structure. The method also includes recessing the insulating layer, so that a top surface of the recessed insulating layer is lower than that of the patterned hard mask structure. The method also includes recessing the patterned hard mask structure, so that the top surface of the recessed insulating layer is substantially level to that of the recessed patterned hard mask structure. The method also includes performing a multi-step etching process using a process gas comprising a first etching gas and a second etching gas. The multi-step etching process includes a first step of selectively removing the recessed patterned hard mask structure, a second step of in-situ and selectively removing a portion of the recessed insulating layer to form an isolation feature, and a third step of in-situ and selectively removing a portion of the liner layer above the isolation feature.

In some embodiments, a method for forming a semiconductor device structure is provided. The method includes providing a substrate having a plurality of first fin structures parallel to each other in a first region and a plurality of second fin structures parallel to each other in a second region. Each first fin structure and each second fin structure are capped by a patterned hard mask structure, respectively. The method also includes forming a liner layer and an overlying insulating layer in each first space between the adjacent first fin structures and each second space between the adjacent second fin structures, respectively. The method also includes performing a first multi-step etching process using a process gas comprising a first etching gas and a second etching gas. The first multi-step etching process includes a first step of selectively removing the patterned hard mask structure, a second step of in-situ and selectively removing a portion of the insulating layer in each first space and each second space, respectively, so as to form an isolation feature in each first space and each second space, respectively, and a third step of in-situ and selectively removing a portion of the liner layer above the isolation feature in each first space and each second space, respectively. The process gas used in the first multi-step etching process is not excited in a plasma state.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    providing a substrate having a first fin structure and a second fin structure that are capped by a patterned hard mask structure;
    forming a liner layer and an overlying insulating layer between the first fin structure and the second fin structure; and
    performing a multi-step etching process using a process gas comprising a first etching gas and a second etching gas, comprising:
        a first step of selectively removing the patterned hard mask structure; and
        a second step of in-situ and selectively removing a portion of the insulating layer to form an isolation feature,
    wherein a first flow rate of the first etching gas is greater than that of the second etching gas in the first step and a second flow rate of the first etching gas is less than that of the second etching gas in the second step.

2. The method as claimed in claim 1, wherein the multi-step etching process further comprises a third step of in-situ and selectively removing a portion of the liner layer above the isolation feature, wherein a third flow rate of the first etching gas is greater than that of the second etching gas in the third step.

3. The method as claimed in claim 1, wherein the process gas used in the multi-step etching process is not excited in a plasma state.

4. The method as claimed in claim 1, further comprising successively recessing the insulating layer and the patterned hard mask structure before performing the multi-step etching process, so that a top surface of the recessed insulating layer is substantially level to that of the recessed patterned hard mask structure.

5. The method as claimed in claim 1, wherein the patterned hard mask structure comprises a pad oxide layer and an overlying nitride layer, the liner layer comprises nitride, and the insulating layer comprises oxide, and wherein the first etching gas is a hydrogen fluoride gas and the second etching gas is an ammonia gas.

6. The method as claimed in claim 5, wherein the process gas further comprises a dilute gas comprising nitrogen, argon, or a combination thereof.

7. The method as claimed in claim 1, wherein the first fin structure or the second fin structure comprises a bottom portion and a top portion, and wherein the bottom portion is made of silicon and the top portion is made of silicon germanium (SiGe).

8. The method as claimed in claim 1, further comprising forming a gate structure over each of the first fin structure and the second fin structure, wherein the gate structure comprises:
    a gate dielectric layer; and
    a gate electrode layer over the gate dielectric layer.

9. A method for forming a semiconductor device structure, comprising:
    providing a substrate having a first fin structure and a second fin structure that are capped by a patterned hard mask structure;
    forming a liner layer and an overlying insulating layer between the first fin structure and the second fin structure;
    recessing the insulating layer, so that a top surface of the recessed insulating layer is lower than that of the patterned hard mask structure;
    recessing the patterned hard mask structure, so that the top surface of the recessed insulating layer is substantially level to that of the recessed patterned hard mask structure; and
    performing a multi-step etching process using a process gas comprising a first etching gas and a second etching gas, comprising:
        a first step of selectively removing the recessed patterned hard mask structure;
        a second step of in-situ and selectively removing a portion of the recessed insulating layer to form an isolation feature; and
        a third step of in-situ and selectively removing a portion of the liner layer above the isolation feature.

10. The method as claimed in claim 9, wherein the process gas used in the multi-step etching process is not excited in a plasma state.

11. The method as claimed in claim 10, wherein a first flow rate of the first etching gas is greater than that of the second etching gas in the first step, a second flow rate of the first etching gas is less than that of the second etching gas in the second step, and a third flow rate of the first etching gas is greater than that of the second etching gas in the third step.

12. The method as claimed in claim 9, further comprising forming a gate structure over each of the first fin structure and the second fin structure, wherein the gate structure comprises:
    a gate dielectric layer; and
    a gate electrode layer over the gate dielectric layer.

13. The method as claimed in claim 9, wherein the hard mask structure is recessed by a wet etching process.

14. A method for forming a semiconductor device structure, comprising:
    providing a substrate having a plurality of first fin structures parallel to each other in a first region and a plurality of second fin structures parallel to each other in a second region, wherein each first fin structure and each second fin structure are capped by a patterned hard mask structure, respectively;
    forming a liner layer and an overlying insulating layer in each first space between the adjacent first fin structures and each second space between the adjacent second fin structures, respectively; and
    performing a first multi-step etching process using a process gas comprising a first etching gas and a second etching gas, comprising:
        a first step of selectively removing the patterned hard mask structure;
        a second step of in-situ and selectively removing a portion of the insulating layer in each first space and each second space, respectively, so as to form an isolation feature in each first space and each second space, respectively; and
        a third step of in-situ and selectively removing a portion of the liner layer above the isolation feature in each first space and each second space, respectively,
    wherein the process gas used in the first multi-step etching process is not excited in a plasma state.

15. The method as claimed in claim 14, wherein a first flow rate of the first etching gas is greater than that of the second etching gas in the first step, a second flow rate of the first etching gas is less than that of the second etching gas in the second step, and a third flow rate of the first etching gas is greater than that of the second etching gas in the third step.

16. The method as claimed in claim 14, further comprising performing a second multi-step etching process to remove a portion of the isolation feature and a portion of the liner layer in each first space and each second space, respectively, so that the liner layer in each first space has a height that is different from that of the liner layer in each second space.

17. The method as claimed in claim 16, wherein the width of each first space is narrower than that of each second space, and the height of the liner layer in each first space is higher than that of the liner layer in each second space.

18. The method as claimed in claim 16, wherein the second multi-step etching process is performed using a process gas that is the same as that used in the first multi-step etching process, and the process gas used in the second multi-step etching process is not excited in a plasma state.

19. The method as claimed in claim 18, wherein the second multi-step etching process comprises a first etching step, a second etching step and a cleaning step performed before the second etching step, and the process gas used in the second multi-step etching process is stopped during the cleaning step.

20. The method as claimed in claim 14, further comprising forming a gate structure over each of the plurality of first fin structures and each of the plurality of second fin structures, respectively, wherein the gate structure comprises:
    a gate dielectric layer; and
    a gate electrode layer over the gate dielectric layer.

* * * * *